United States Patent [19]

Harada

[11] Patent Number: 5,311,479
[45] Date of Patent: May 10, 1994

[54] SEMICONDUCTOR MEMORY DEVICE HAVING A CMOS DECODING CIRCUIT

[75] Inventor: Teruhiro Harada, Tokyo, Japan

[73] Assignee: Oki Electric Industry Co., Ltd., Tokyo, Japan

[21] Appl. No.: 931,975

[22] Filed: Aug. 19, 1992

[30] Foreign Application Priority Data

Aug. 20, 1991 [JP] Japan .................. 3-208040

[51] Int. Cl.$^5$ .................. G11C 7/00; G11C 8/00
[52] U.S. Cl. .................. 365/230.06; 365/189.01; 365/189.05; 307/463; 307/449; 307/445; 307/443
[58] Field of Search .............. 307/449, 451, 463, 468, 307/469, 445, 443; 365/230.6, 185, 189.09, 189.01, 189.05

[56] References Cited

U.S. PATENT DOCUMENTS

| | | | |
|---|---|---|---|
| 4,281,397 | 7/1981 | Neal et al. | 365/63 |
| 4,344,005 | 8/1982 | Stewart | 307/463 |
| 4,797,576 | 1/1989 | Asazawa | 307/445 |
| 4,951,259 | 8/1990 | Sato et al. | 365/230.06 |
| 5,132,933 | 7/1992 | Schreck et al. | 365/189.09 |

Primary Examiner—Eugene R. LaRoche
Assistant Examiner—Son Mai
Attorney, Agent, or Firm—Spencer, Frank & Schneider

[57] ABSTRACT

The semiconductor memory device receives a first and a second pairs of input signals. Each of the pairs has a first and a second address signals which are complementary and substantially in phase. The semiconductor memory device comprises a pre-decoder for receiving the first and second pairs of input signals and outputting a first and second pre-decode signals. The first and second pre-decode signals are complementary signals and are substantially in phase with each other. The pre-decoder comprises a NAND gate for receiving the first input signals of the first and second pairs and outputting the first pre-decode signal and a NOR gate for receiving the second input signals of the first and second pairs and outputting the second pre-decode signal. The NOR gate and the NAND gate are electrically isolated from each other. The semiconductor memory device further comprises a row decoder coupled to the pre-decoder and word lines for selecting one of the word lines in response to the pre-decode signals and a memory array coupled to the row decoder through the word lines.

14 Claims, 5 Drawing Sheets

SEMICONDUCTOR MEMORY DEVICE HAVING A CMOS DECODING CIRCUIT

CROSS REFERENCE TO RELATED APPLICATIONS

This application claims priority of Japanese Patent application Ser. No. 3-208,040, filed Aug. 20, 1991, the subject matter of which is incorporated herein by reference.

BACKGROUND OF THE INVENTION

The present invention relates to a semiconductor memory device, and more particularly to a semiconductor memory device having a CMOS decoding circuit for generating complementary decode signals.

A processor comprising a read-only memory (ROM), an electrically erasable and programmable ROM (EEPROM) and a central processing unit (CPU) has a CMOS decoding circuit for decoding input signals so as to output complementary decode signals which are out of phase with each other. FIG. 1 is a circuit diagram showing a CMOS decoding circuit of a semiconductor memory device for generating decode signals XPia, XPib.

The CMOS decoding circuit has a two input NAND gate 101 which is supplied with address signals Ca, Da and whose output node N1 is electrically connected to an inverter 103 and connected to an inverter 105 via the inverter 103 and a node N2.

When the address signals Ca, Da are input to the NAND gate 101, the NAND gate 101 determines a negative AND and outputs an output signal indicative of the result of negative ANDing at the node N1. The output signal is inverted by the inverter 103 to produce a first inverted signal. Then, the first inverted signal is delivered to the node N2 to be output as a decode signal XPia. The first inverted signal is inverted again by the inverter 105 to be output as an inverted decode signal XPib from the node N3. Since the output signal referred to above is successively inverted by the inverters 103, 105, the output signal is delivered to the node N3 after a signal propagation delay.

When the address signals Ca, Da are both "H" in level (i.e., Upon selection of both address signals Ca, Da as the "H" level), the CMOS decoding circuit outputs a decode signal XPia of an "H" level and an inverted decode signal XPib of an "L" level. When, on the other hand, either one of the address signals Ca, Da is "L" in level (i.e., Upon non-selection of either of the address signals Ca, Da as the "H" level), the CMOS decoding circuit outputs a decode signal XPia of an "L" level and an inverted decode signal XPib of an "H" level.

In the CMOS decoding circuit shown in FIG. 1, as described above, the decode signal XPia is inverted to produce the inverted decode signal XPib, thereby outputting the complementary decode signals XPia, XPib from the CMOS decoding circuit. Therefore, the phase of the decode signal XPia is shifted from that of the decode signal XPib by the propagation delay time of the inverter 105 because the decode signal XPia is fed through only one inverter whereas the decode signal XPib is fed through two inverters.

When a circuit for a semiconductor memory device is designed on a large scale and the capacity of each inverter for driving a load is increased in particular, the phase difference or shift between the decode signals XPia and XPib becomes correspondingly greater. Consequently, the D.C. current momentarily flows into word line drivers supplied with the outputs of the CMOS decoding circuit during a period in which the phase difference between the decode signals XPia and XPib is being produced, thereby increasing the power consumption of the semiconductor memory device. In addition, the signal propagation or transfer speed is determined by either the decode signal XPia or XPib which has a phase lag, thereby creating a difficulty in operating the CMOS decoding circuit at a high speed.

SUMMARY OF THE INVENTION

With the foregoing problems in view, it is an object of the present invention to provide a semiconductor memory device having a CMOS decoding circuit for generating complementary decode signals which are substantially in phase.

It is another object of the present invention to provide a semiconductor memory device having a CMOS decoding circuit in which the semiconductor memory device has less current consumption.

It is a further object of the present invention to provide a CMOS decoding circuit as part of a lo semiconductor memory device which is operable at a high speed.

The semiconductor memory device according to the present invention receives a first and a second pair of input signals. Each of the pairs has a first and a second address signal which are complementary and substantially in phase with each other. The semiconductor memory device according to the present invention comprises a pre-decoder for receiving the first and second pairs of input signals and outputting a first and second pre-decode signals which are complementary and substantially in phase with each other. The pre-decoder comprises a NAND gate for receiving the first address signals of the first and second pairs and outputting the first pre-decode signal and a NOR gate electrically isolated from the NAND gate, for receiving the second address signals of the first and second pairs and outputting the second pre-decode signal. The semiconductor memory device according to the present invention further comprises a row decoder coupled to the pre-decoder and a plurality of word lines for selecting one of the word lines in response to the pre-decode signals and a memory array coupled to the row decoder through the word lines.

The above and other objects, features and advantages of the present invention will become apparent from the following description and the appended claims, taken in conjunction with the accompanying drawings in which preferred embodiments of the present invention are shown by way of illustrative example.

DETAILED DESCRIPTION OF THE PREFERRED EMBODIMENTS

Figure 1:
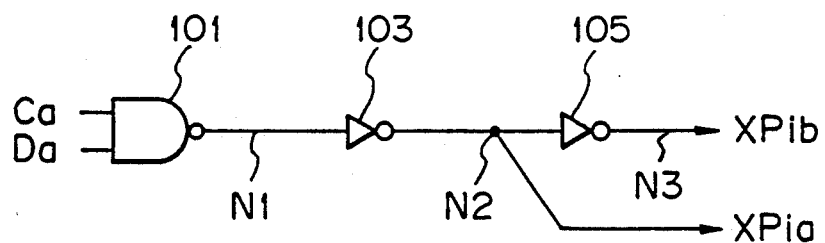
FIG. 1 is a circuit diagram of a conventional CMOS decoding circuit.
Figure 2:
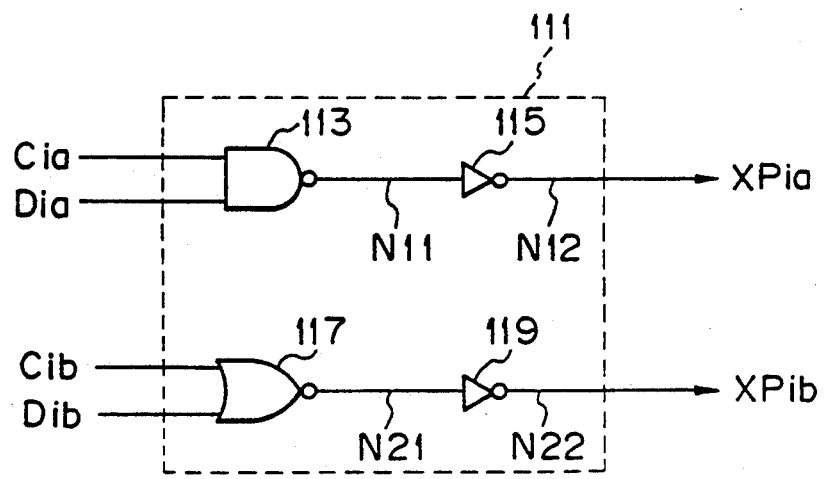
FIG. 2 is a circuit diagram of a CMOS decoding circuit according to a first embodiment of the present invention.
Figure 3:
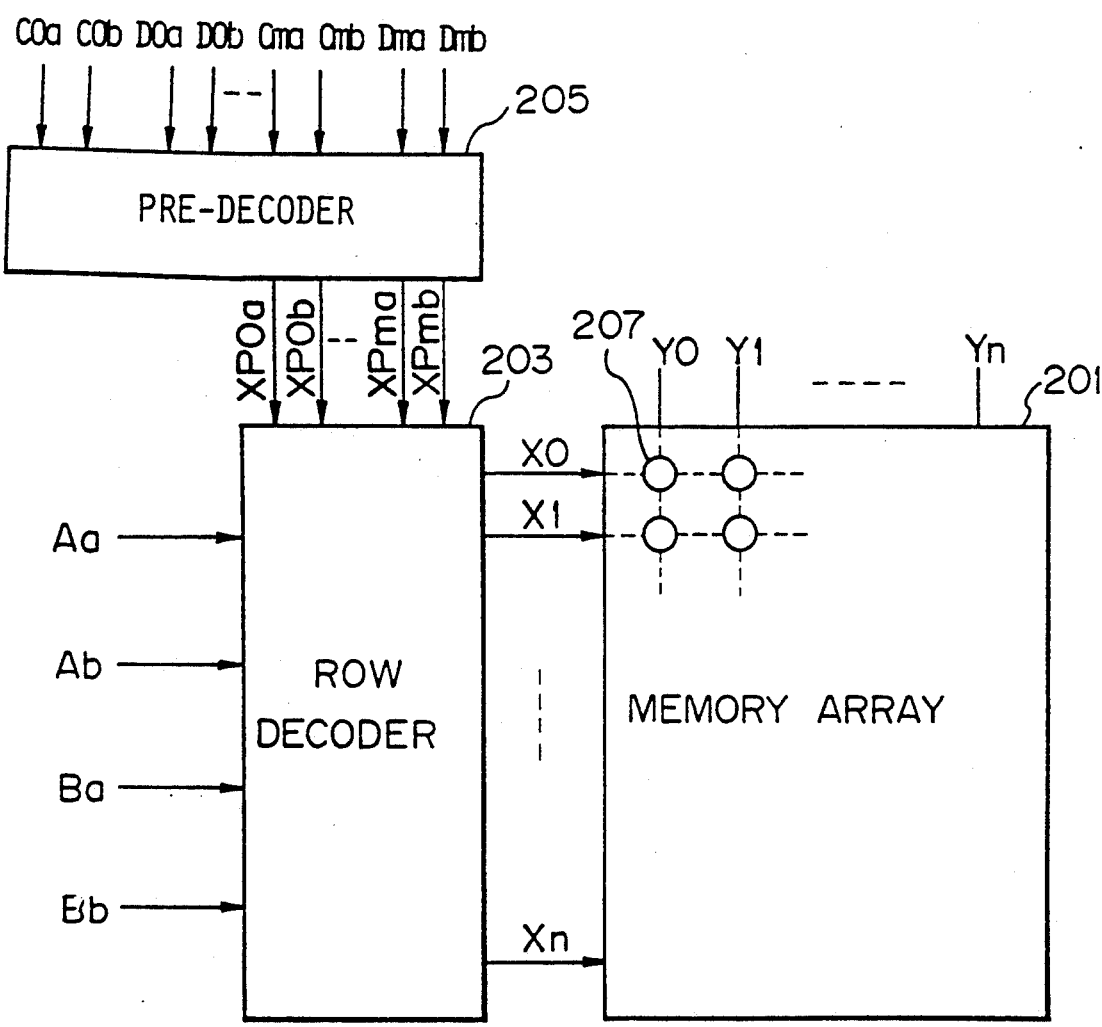
FIG. 3 is a block diagram of a semiconductor memory device according to the first embodiment of the present invention.

FIG. 2 is a circuit diagram of a CMOS decoding circuit according to a first embodiment of the present invention. FIG. 3 is a block diagram of a semiconductor memory device according to the first embodiment of the present invention.

The semiconductor memory device according to the first embodiment of the present invention will now be described with reference to FIG. 3. The semiconductor memory device comprises a memory array 201 for storing data, a row decoder 203 and a pre-decoder 205.

The memory array 201 has a plurality of word lines X0, X1, ..., Xn and a plurality of bit lines Y0, Y1, ..., Yn which intersect the word lines X0, X1, ..., Xn respectively. A plurality of read-only memory cells 207 are respectively arranged in matrix form at the positions where the word lines and the bit lines intersect with one another respectively.

The output terminals of the pre-decoder 205 are electrically connected to the corresponding input terminals of the row decoder 203. The output terminals of the row decoder 203 are electrically connected to the corresponding word lines X0, X1, ... Xn, respectively. The pre-decoder 205 serves as a circuit which decodes a plurality of pairs of complementary address signals COa, COb, DOa, DOb, ..., Cma, Cmb, Dma, Dmb so as to output a plurality of pairs of complementary pre-decode signals XP0a, XP0b, ..., XPma, XPmb to the row decoder 203. The row decoder 203 serves as a circuit which receives a plurality of pairs of complementary address signals Aa, Ab, Ba, Bb and the pre-decode signals XP0a, XP0b, ..., XPma, XPmb and selectively drives the word lines X0, Xl, ..., Xn electrically connected to the gate electrodes of the memory cells 207 respectively.

In order to read data from the memory cells 207 of the memory array 201, the address signals Aa, Ab, Ba, Bb are supplied to the row decoder 203 and the address signals COa, COb, DOa, DOb, ..., Cma, Cmb, Dma, Dmb are supplied to the pre-decoder 205. The pre-decoder 205 decodes the address signals COa, COb, DOa, DOb, ..., Cma, Cmb, Dma, Dmb to output the pre-decode signals XP0a, XP0b, ..., XPma, XPmb to the row decoder 203.

If the memory array 201 is of a NOR type configuration, the row decoder 203 decodes the address signals Aa, Ab, Ba, Bb and brings only one of the word lines X0, X1, ..., Xn to an "H (High)" level based on the pre-decoded signal XP0a, XP0b, ..., XPma, XPmb and the decoded address signals Aa, Ab, Ba, Bb. In this case, the remaining word lines are rendered "L (Low)" in level. As a result, data can be read from the memory cell 207 at the position where the one word line of the "H" level intersects any one of the bit lines Y0, Y1, ... Yn, which has been selected by another address signal.

However, if the memory array 201 is of a NAND type configuration, the row decoder 203 decodes the address signals Aa, Ab, Ba, Bb and brings only one of the word lines X0, X1, ..., Xn to an "L" in level (and renders the remaining word lines "H" in level), thereby reading data from a memory cell 207 at the position where any one of the word lines X0, X1, ..., Xn, which has been brought to the "L" level, intersects one of the bit lines Y0, Y1, ..., Yn, which has been selected by another address signal.

Figure 4:
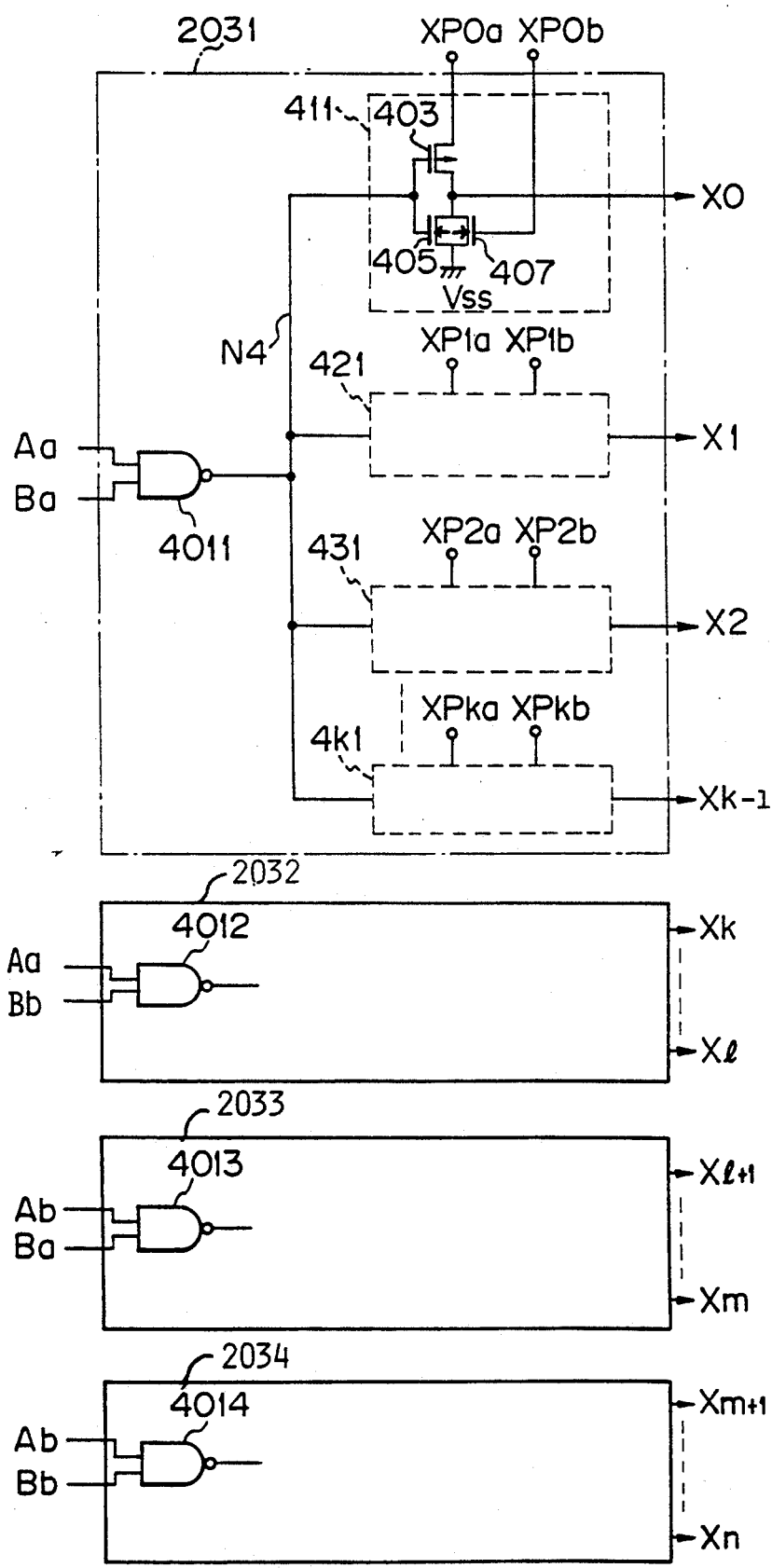
FIG. 4 is a circuit diagram of a row decoder employed in the semiconductor memory device shown in FIG. 3.

FIG. 4 is a circuit diagram showing the row decoder 203 shown in FIG. 3. A first row decoder unit 2031 has a two-input NAND gate 4011 which determines the negative AND logic of the address signals Aa, Ba and whose output node N4 is electrically connected with k (where $k = (n+1)/4$) and $n+1$ represents the total number of word lines in row decoder 203 word line drives 411, 421, 431, ..., 4k1.

The row decoder 203 comprises the above first row decoder unit 2031 and row decoder units 2032, 2033, 2034 whose four NAND gates 4011, 4012, 4013, 4014 are supplied with the pairs of address signals Aa, Ba; Aa, Bb; Ab, Ba; Ab, Bb, respectively. The four row decoder units 2031 through 2034 each have k decoders which drive all the word lines X0 through Xn. The four row decoder units 2031 through 2034 are identical in structure to one another. Therefore, only the first row decoder unit 2031 has been illustrated in detail but other row decoders have been roughly described as shown in FIG. 4.

The word line drivers 411, 421, 431, ..., 4k1 are circuits which make use of a plurality of pairs of complementary pre-decode signals XP0a, XP0b, ..., XPka, XPkb as supply voltages respectively and selectively drive the word lines X0, Xl, ..., 4k1 respectively. The word line driver 411 comprises an inverter comprised of a P channel MOS transistor (hereinafter called "PMOS") 403 electrically connected between an output of the inverter and a terminal where the pre-decode signal XP0a is applied, an N channel MOS transistor (hereinafter called "NMOS") 405 and an NMOS 407 both of which are electrically connected between the output of the inverter and a ground level VSS.

signal XPia ($i = 2^L$, where L is the number of addresses allocated to the pre-decoder 205) is supplied to a voltage source (corresponding to the source electrode of the PMOS 403) of the inverter. Further, an inverted pre-decode signal XPib is supplied to the gate of the NMOS 407. The total number of the word line drivers 411, 421, 431, ..., 4k1 which exist in 7 the first row decoder 2031, is $2^L/4$ and the gate inputs of the word line drivers 411, 421, 431, ..., 4k1 are all connected to the common node N4.

The operation of the first row decoder unit 2031 will now be described.

When either one of the address signals Aa, Ba input put to the NAND gate 4011 is "L" in level, the node N4 is maintained at an "H" level and the inverters render the word lines X0, Xl, ... Xk "L" in level respectively regardless of the levels of the pre-decode signals XPia, XPib ($i = 0, 1, ..., m$). When the two address signals Aa, Ba input to the NAND gate 4011 are both "H" in level, the node N4 is maintained at an "L" level.

Only one of the pre-decode signals XPia ($i = 0, 1, ..., m$) is "H" in level whereas the pre-decode signal XPib ($i = 0, 1, ..., m$) of opposite phase, which corresponds to the pre-decode signal XPia, is "L" in level. Assuming that the pre-decode signal XP0a is "H" in level and the inverted pre-decode signal XP0b is "L" in level, for example, other pre-decode signals XP1a through XPma are "L" in level and other inverted predecode signals XPmb through XPmb are "H" in level.

Accordingly, the word line X0 is rendered "H" in level because the PMOS 403 for driving the word line X0 is turned on and the NMOSs 405, 407 are turned off. Other word lines X1 through Xn are "L" in level because the NMOS 407 is in an on state.

As described above, the row decoder 203 renders only one of the word lines X0, X1, ..., Xn "H" in level when the memory array 201 is of a NOR type. In the above-described embodiment, the row decoder unit 2031 is provided with the two input NAND gate 4011. However, the number of inputs of the NAND gate varies depending on the number of the word lines.

Since the row decoder 203 makes use of the pre-decode signals XP0a, XP1a, ..., XPma as the supply voltages for the word line drivers 411, 421, 431, ..., 4k1 decoding and patterning processes can be easily carried out at a high speed. This type of row decoder 203 requires the complementary pre-decode signals XP0a, XP0b ..., XPma, XPmb.

FIG. 2 is a circuit diagram showing the CMOS decoding circuit according to the first embodiment of the present invention, for generating the pre-decode signals XPia, XPib used for the control of the supply voltages for the word line drivers 411, 421, 431, ..., 4k1 shown in FIG. 4.

A CMOS decoding circuit 111 is disposed in the pre-decoder 205 of the semiconductor memory device shown in FIG. 3. The CMOS decoding circuit 111 has a two input NAND gate 113 which generates a NAND signal based on two positive-phase pre-decode signals Cia, Dia and whose output node N11 is electrically connected via a signal inverter 115 to a node N12 for outputting a positive-phase pre-decode signal XPia. In addition, the CMOS decoding circuit 111 has a two input NOR gate 117 which generates a NOR signal based on two antiphase address signals Cib, Dib and whose output node N21 is electrically connected via an inverter 119 to a node N22 for outputting an inverted pre-decode signal XPib.

The output nodes N12, N22 are electrically connected to the word line drivers 411, 421, 431, ..., 4k1 respectively, of the row decoder unit 2031 shown in FIG. 4.

The operation of the CMOS decoding circuit 111 will now be described below.

The positive-phase address signals Cia, Dia are supplied to the NAND gate 113 and the antiphase address signals Cib, Dib are supplied to the NOR gate 117. When either one of the address signals Cia, Dia is "L" in level, the NAND gate 113 outputs an "H" level signal to the node N11. The inverter 115 outputs a pre-decode signal XPia of an "L" level to the node N12 in response to the "H" level signal output to the node N11.

On the other hand, either one of the address signals Cib, Dib input to the NOR gate 117 is "H" in level because the address signals Cib, Dib are opposite in phase to the address signals Cia, Dia respectively. Therefore, the NOR gate 117 outputs an "L" level signal to the node N21. The inverter 119 outputs an inverted pre-decode signal XPib of an "H" level to the node N22 in response to the "L" level signal output to the node N21 of the NOR gate 117.

When each of the address signals Cia, Dia is then brought to an "H" level from this condition, the address dress signals Cib, Dib are also rendered "L" in level simultaneously with the above level transition. At this time, the NAND gate 113 and the NOR gate 117 output the "L" and "H" level signals to the nodes N11 and N21 respectively. Upon receipt of both level signals, the nodes N12 and N22 are respectively brought to the "H" and "L" levels by the inverters 115 and 119 substantially in concurrence with each other.

The complementary pre-decode signals XPia, XPib output from the nodes N12 and N22 respectively are supplied to the word line drivers 411, 421, 431, ... shown in FIG. 4 respectively. Therefore, the row decoder 203 shown in FIG. 3 selectively drives the word lines X0, X1, ..., Xn to thereby read desired data from a memory cell at the position where the selected one of the word lines X0, X1, ..., Xn intersects one of the bit lines Y0, Y1, ..., Yn, which has been selected by another address signal (not shown).

As described above, the CMOS decoding circuit according to the present embodiment is provided with the NAND gate 113 and the NOR gate 117 which are supplied with the address signals as the complementary signals corresponding to the positive-phase address signals Cia, Dia, and the antiphase address signals Cib, Dib. Therefore, the pre-decode signal XPia and the inverted pre-decode signal XPib are produced after they have been fed through two-stage circuits respectively.

Therefore, a phase shift is not produced between the positive-phase pre-decode signal XPia output from the node N12 and the inverted pre-decode signal XPib output from the node N22. Thus, the D.C. current can be prevented from flowing into the word line drivers 411, 421, 431, ..., 4k1 owing to the phase shift developed in the conventional CMOS decoding circuit, thereby making it possible to reduce power consumption. Further, since the complementary pre-decode signals XPia and XPib are in phase with each other, the CMOS decoding circuit can be operated at a high speed.

Figure 5:
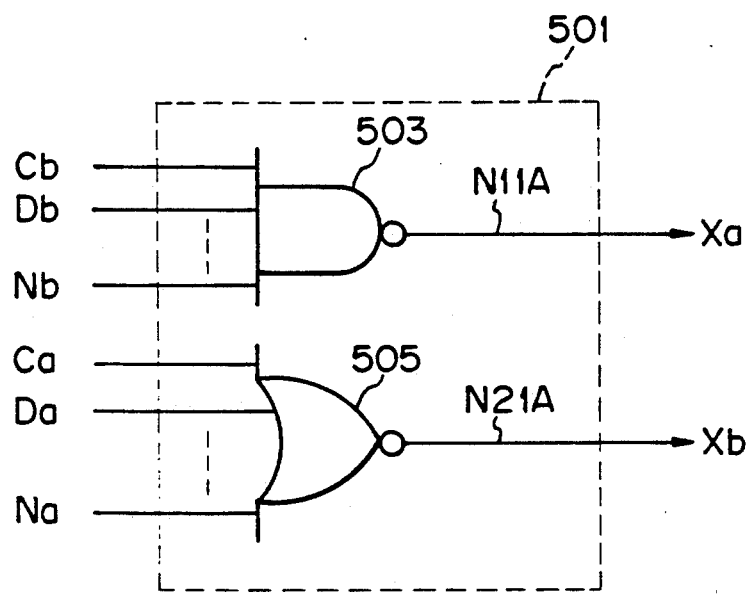
FIG. 5 is a circuit diagram of a CMOS decoding circuit according to a second embodiment of the present invention.

FIG. 5 is a circuit diagram of a CMOS decoding circuit according to a second embodiment of the present invention.

A CMOS decoding circuit 501 comprises a multi-input NAND gate 503 supplied with antiphase address signals Cb, Db, ..., Nb so as to output a positive-phase pre-decode signal Xa to an output node N11A and a multi-input NOR gate 505 supplied with positive-phase address signals Ca, Da, ..., Na so as to output an antiphase pre-decode signal Xb to an output node N21A.

When the address signals Ca, Da, ..., Na are supplied to the NOR gate 505, the NOR gate 505 performs a negative OR operation and outputs an antiphase pre-decode signal Xb corresponding to an output signal indicative of the result of the negative ORing to the node N21A. At the same time, the antiphase address signals Cb, Db, ..., Nb are supplied to the NAND gate 503. Thus, the NAND gate 503 performs a negative AND operation and outputs a positive-phase pre-decode signal Xa corresponding to an output signal indicative of the result of the negative ANDing to the node N11A.

The CMOS decoding circuit 501 is provided with the NAND gate 503 and the NOR gate 505 which are supplied with the complementary address signals Cb, Db, Nb and Ca, Da, ..., Na respectively. Thus, the complementary pre-decode signals Xa, Xb are output from the CMOS decoding circuit 501 after they have passed through one-stage circuits respectively. It is therefore possible to obtain the same advantages as those obtained by the first embodiment. Further, since the CMOS decoding circuit 501 is not provided with the inverters 115, 119 shown in FIG. 2, a signal propagation delay developed in each of the inverters 115, 119 can be avoided and the signal propagation speed can be increased higher although the drive capacity of the CMOS decoding circuit 501 with respect to the load is reduced.

Figure 6:
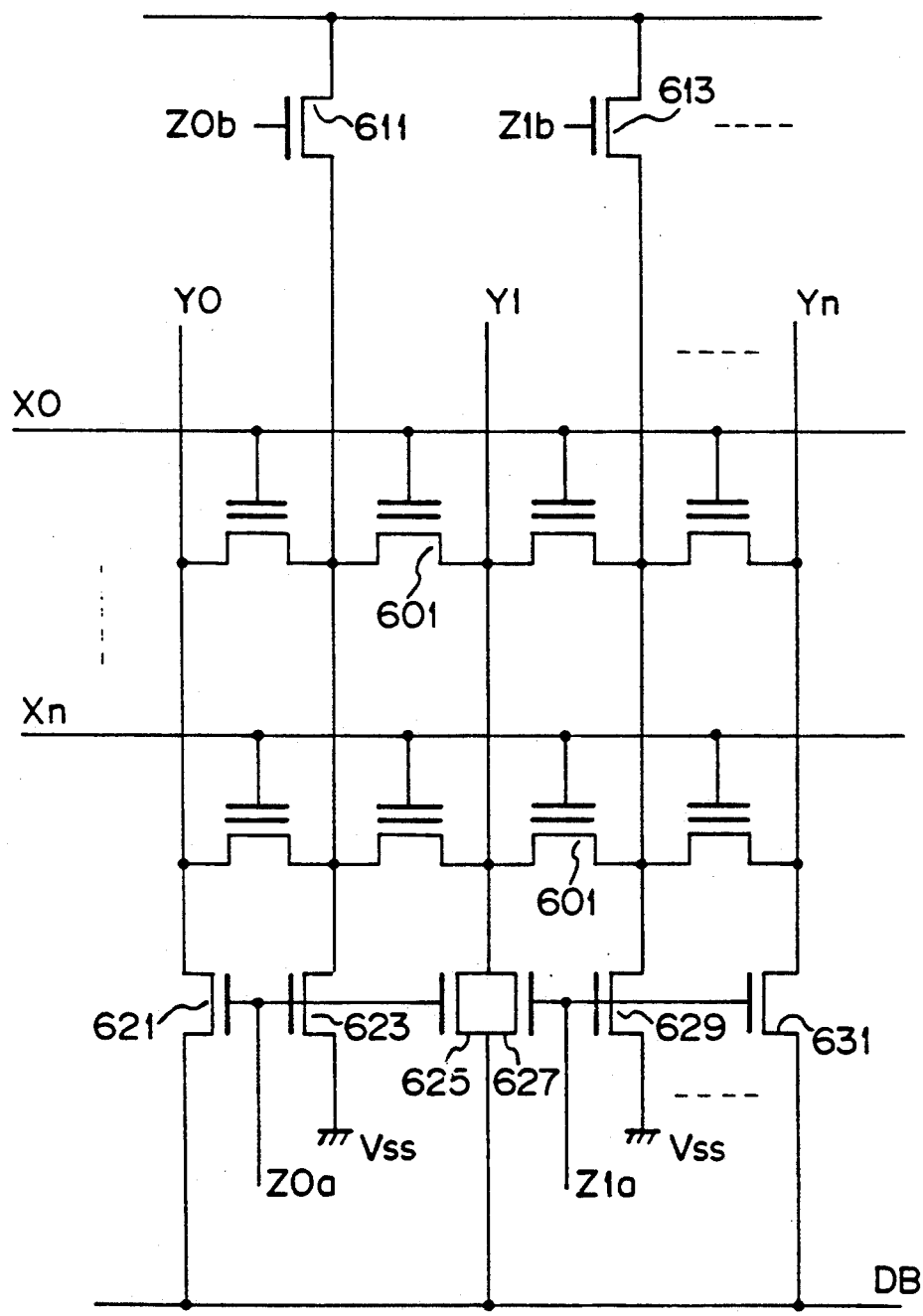
FIG. 6 is a circuit diagram of a CMOS decoding circuit according to a third embodiment of the present invention.

FIG. 6 is a schematic circuit diagram of an EEPROM of complementary type bit-line configuration, which illustrates a third embodiment of the present invention.

The EEPROM has a plurality of floating gate type memory cells 601 arranged in a matrix form at positions where a plurality of word lines X0 through Xn intersect a plurality of bit lines Y0 through Yn respectively. A plurality of source-line bias switches 611, 613, ..., which are turned on and off by antiphase control signals Z0$b$, Z1$b$, ... respectively, are actuated to select the memory cells 601 respectively, thereby outputting data read on the bit lines Y0 through Yn to a data bus DB via a plurality of column switches 621, 623, 625, which are turned on and off by positive-phase control signals Z0$a$, Z1$a$, ....

If the complementary control signals Z0$b$, Z1$b$ and Z0$a$, Z1$a$, ..., which are respectively supplied to the source-line bias switches 611, 613, ... and the column switches 621, 623, ... in the EEPROM, are generated by the CMOS decoding circuit shown in FIG. 2 or FIG. 5, then data can be accurately accessed without any phase shift.

The present invention is not necessarily limited to the above embodiments and many modifications can be made. The following modifications can be shown by way of illustrated example.

(i) In the first and second embodiments, the NAND gate and the NOR gate are provided in pairs. However, they may be provided in plural pairs depending on the required number of pre-decoded signals.

(ii) Desired inverters may be additionally connected to the outputs of the NAND gate and the NOR gate employed in each of the first and second embodiments to generate pre-decode signals having arbitrary polarity or to improve the drive capacity.

Having now fully described the invention, it will be apparent to those skilled in the art that many changes and modifications can be made without departing from the spirit or scope of the invention as set forth herein.

What is claimed is:

1. A semiconductor memory device receiving a first and a second pair of input signals, each of said pairs of input signals including a first address signal having a predetermined phase and a second address signal, the first and second address signals of each of said first and second pairs of input signals being complementary and substantially in phase with each other, the semiconductor memory comprising:
a pre-decoder for receiving the first and second pairs of input signals and outputting first and second pre-decode signals, said pre-decoder comprising:
a NAND gate having input terminals for receiving the first address signal of the first pair of input signals and the first address signal of the second pair of input signals, said NAND gate including a first pre-decode output terminal for outputting the first pre-decode signal; and
a NOR gate, electrically isolated from said NAND gate, having input terminals for receiving the second address signal of the first pair of input signals and the second address signal of the second pair of input signals, said NOR gate including a second pre-decode output terminal for outputting the second pre-decode signal, the first and second pre-decode signals being complementary and substantially in phase with each other;
a memory array having a plurality of bit lines, a plurality of word lines and a plurality of memory cells; and
a row decoder, coupled to the pre-decoder and the plurality of word lines of said memory array, for selecting one of the word lines in response to the first and second pre-decode signals.

2. A semiconductor memory device according to claim 1, wherein said pre-decoder further comprises:
a first inverter having an input terminal coupled to the output terminal of the NAND gate and an output terminal coupled to the first pre-decode output terminal, and
a second inverter having an input terminal coupled to the output terminal of the NOR gate and an output terminal coupled to the second pre-decode output terminal.

3. A semiconductor memory device according to claim 1, wherein said pre-decoder further comprises a plurality of NAND gates and a plurality of NOR gates.

4. A semiconductor memory device according to claim 1, wherein said row decoder further comprises a plurality of row decoder units.

5. A semiconductor memory device according to claim 4, wherein each row decoder unit has a gate circuit having an input terminal for receiving a further address signal and an output terminal.

6. A semiconductor memory device according to claim 5, wherein each row decoder unit comprises a plurality of word line drivers, each of which is coupled to one of the word lines, the output terminal of the gate circuit and output terminals of the NAND gate and the NOR gate of said pre-decoder.

7. A semiconductor memory device receiving a first and a second pair of input signals, each of said pairs of input signals including a first address signal having a predetermined phase and a second address signal, the first and second address signals of each of said first and second pairs of input signals being complementary and substantially in phase with each other, the semiconductor memory device comprising:
a plurality of floating gate type memory cells, each having a first, a second and a gate electrode, said memory cells storing data;
a plurality of word lines, each being coupled to the gate electrodes of said memory cells;
a plurality of bit lines, each being coupled to the first electrodes of said memory cells;
a plurality of first source lines, each being coupled to the second electrodes of said memory cells;
a plurality of source line switches, each having a control terminal, each of said source line switches being coupled between a second source line and one of said first source lines;
a data bus for transferring the data read from said memory cells;
a plurality of first column switches, each having a control terminal, each of said first column switches being coupled between said data bus and one of said bit lines;
a plurality of second column switches, each having a control terminal connected to control terminal of a corresponding first column switch, each of said second column switches being coupled between a reference potential and one of said first source lines; and a control circuit having a first, a second, a third and a fourth input terminal and a first and a second output terminal connected to the control terminals of said source line switches and said column switches, said control circuit receiving the first address signal of the first pair of input signals through the first input terminal, the second address signal of the first pair of input signals through the second input terminal, the first address signal of the second pair of input signals through the third input terminal and the second address signal of the second pair of input signals through the fourth input terminal and outputting first and second control signals from the first and the second output terminals respectively, said control circuit comprising:

a NAND gate having a first and a second input terminal coupled to the first and third input terminals of said control circuit respectively, and an output terminal coupled to the first output terminal of said control circuit; and a NOR gate having a first and a second input terminal coupled to the second and fourth input terminals of said control circuit respectively, and an output terminal coupled to the second output terminal of said control circuit, the first and second control signals being complementary and substantially in phase with each other.

8. A semiconductor memory device according to claim 7, wherein said control circuit further comprises:

a first inverter coupled between the output terminal of the NAND gate and the first output terminal of said control circuit; and a second inverter coupled between the output terminal of the NOR gate and the second output terminal of said control circuit.

9. A semiconductor memory device according to claim 7, wherein the reference potential is a ground.

10. A semiconductor memory device according to claim 7, wherein said plurality of source line switches, said plurality of first column switches and said plurality of second column switches are MOS switches.

11. A decoder circuit receiving a first and a second pair of input signals, each of said pairs f input signals including a first address signal having a predetermined phase and a second address signal, the first and second address signals of each of said first and second pairs of input signals being complementary and substantially in phase with each other, the decoder circuit comprising:

a first input terminal for receiving the first address signal of the first pair of input signals;

a second input terminal for receiving the second address signal of the first pair of input signals;

a third input terminal for receiving the first address signal of the second pair of input signals;

a fourth input terminal for receiving the second address signal of the second pair of input signals;

a NAND gate having a first and a second input coupled to the first and third input terminals respectively and an output for outputting a first pre-decode signal;

a NOR gate, electrically isolated from said NAND gate, having a first and a second input coupled to the second and fourth input terminals respectively and an output for outputting a second pre-decode signal, the first and second pre-decode signals being complementary and substantially in phase with each other;

a first output terminal coupled to the output of said NAND gate; and a second output terminal coupled to the output of said NOR gate.

12. A decoder circuit according to claim 11, further comprising:

a first inverter coupled between the output of said NAND gate and said first output terminal; and a second inverter coupled between the output of said NOR gate and said second output terminal.

13. A semiconductor memory device receiving a first and a second pair of input signals, each of said pairs of input signals including a first address signal having a predetermined phase and a second address signal, the first and second address signals being complementary and substantially in phase with each other, the semiconductor memory comprising:

a pre-decoder for receiving the first and second pairs of input signals and outputting first and second pre-decode signals, said pre-decoder comprising:

a NAND gate having input terminals for receiving the first address signal of the first pair of input signals and the first address signal of the second pair of input signals, and having a first pre-decode output terminal for outputting the first pre-decode signal; and a NOR gate having input terminals for receiving the second address signal of the first pair of input signals and the second address signal of the second pair of input signals, and having a second pre-decode output terminal for outputting the second pre-decode signal, the first and second pre-decode signals being complementary and substantially in phase with each other;

a memory array having a plurality of bit lines, a plurality of word lines and a plurality of memory cells;

a row decoder, coupled to the pre-decoder and to the plurality of word line of said memory array, for selecting one of the plurality of word lines in response to the first and second pre-decode signals, said row decoder having a plurality of row decoder units each including:

a gate circuit having an input terminal for receiving a further address signal, and an output terminal; and a plurality of word lines drivers, each having:

a first MOS transistor of a first conductive type having a gate electrode coupled to the output terminal of the gate circuit, a first electrode coupled to the output terminal of the NAND gate of the pre-decoder and a second electrode coupled to a corresponding one of the plurality of word lines;

a second MOS transistor of a second conductive type having a gate electrode coupled to the output terminal of the gate circuit, a first electrode coupled to a reference potential and a second electrode coupled to a corresponding one of the plurality of word lines; and a third MOS transistor of a second conductive type having a gate electrode coupled to the output terminal of the NOR gate of the pre-decoder, a first electrode coupled to the reference potential and a second electrode coupled to a corresponding one of the plurality of word lines.

14. A semiconductor memory device according to claim 13, wherein the reference potential is a ground.

* * * * *